(12) United States Patent
Wang et al.

(10) Patent No.: US 11,754,345 B2
(45) Date of Patent: Sep. 12, 2023

(54) HEAT DISSIPATION DEVICE

(71) Applicant: VAST GLORY ELECTRONICS & HARDWARE & PLASTIC(HUI ZHOU) LTD., Hui Zhou (CN)

(72) Inventors: Xue Mei Wang, Hui Zhou (CN); Xianyao Liu, Hui Zhou (CN)

(73) Assignee: VAST GLORY ELECTRONICS & HARDWARE & PLASTIC (HUI ZHOU) LTD., Hui Zhou (CN)

( * ) Notice: Subject to any disclaimer, the term of this patent is extended or adjusted under 35 U.S.C. 154(b) by 14 days.

(21) Appl. No.: 17/468,426

(22) Filed: Sep. 7, 2021

(65) Prior Publication Data
US 2022/0295669 A1   Sep. 15, 2022

(30) Foreign Application Priority Data

Mar. 10, 2021   (CN) .......................... 202110259538.4

(51) Int. Cl.
*F28F 23/02*   (2006.01)
*F28D 15/04*   (2006.01)
*H05K 7/20*   (2006.01)

(52) U.S. Cl.
CPC ......... *F28D 15/046* (2013.01); *F28D 15/043* (2013.01); *F28F 23/02* (2013.01); *F28F 2255/18* (2013.01); *F28F 2275/00* (2013.01); *H05K 7/20336* (2013.01)

(58) Field of Classification Search
CPC ............... F28D 15/046; F28D 15/0275; F28D 15/0233; F28D 15/04; F28D 15/043; F28F 2215/06; F28F 2240/00; F28F 23/02; F28F 2255/18; F28F 2275/00; H05K 7/20336
See application file for complete search history.

(56) References Cited

U.S. PATENT DOCUMENTS

2018/0066898 A1 *   3/2018   Lin ........................ F28D 15/04
2020/0355444 A1 *   11/2020  Chen ................... F28D 15/0283

* cited by examiner

*Primary Examiner* — Tavia Sullens
*Assistant Examiner* — Khaled Ahmed Ali Al Samiri
(74) *Attorney, Agent, or Firm* — Maschoff Brennan (57) ABSTRACT

A heat dissipation device includes an upper cover, a lower cover, an upper wick, a first wick, a plurality of second wicks, a third wick, and a gas-liquid separation plate. The lower cover and the upper cover together form a sealed vacuum chamber therebetween. The upper wick is attached on a first inner surface of the upper cover and is in fluid communication with the second wicks and the third wick. The first wick is attached on a second inner surface of the lower cover. The second wicks are attached on the lower cover. Third wick is attached on a third inner surface of the lower cover and is connected to and in fluid communication with the first wick. The gas-liquid separation plate is attached on a planar area of the third wick so as to separate a vapor from a liquid in the sealed vacuum chamber.

24 Claims, 8 Drawing Sheets

HEAT DISSIPATION DEVICE

CROSS-REFERENCE TO RELATED APPLICATIONS

This non-provisional application claims priority under 35 U.S.C. § 119(a) on Patent Application No(s). 202110259538.4 filed in China, P.R.C. on Mar. 10, 2021, the entire contents of which are hereby incorporated by reference.

TECHNICAL FIELD

The present disclosure relates to a heat dissipation device, more particularly to a heat dissipation device with a composite wick structure and a gas-liquid separation plate.

BACKGROUND

During the operation of a processor, heat generated thereby is needed to be quickly dissipated in order to keep the working temperature within an optimum range. As the electronic technology advances, electronic products become smaller, lighter, thinner and more compact and have improved computing power, leading more heat generated in a smaller space. Therefore, the demand for more efficient and effective heat dissipation solution is increased.

For this reason, vapor chambers are provided. A vapor chamber is a typical heat dissipation device used when high power and heat fluxes are applied to a relatively small evaporator area. The vapor chamber generally has a vacuum sealed enclosure that houses a wick structure and a two-phase working fluid. One side of the enclosure is in thermal contact with a heat source, and the absorbed heat is transfer to the other side through the phase change of liquid to vapor; as the vapor touches the cooled wick, it is condensed into liquid and transported back through the wick structure via capillary action. Therefore, the vapor chamber can spread heat in two dimensions.

However, it is found that the conventional vapor chambers are unable to offer a heat transfer ability sufficient for the applications nowadays due to the wick arrangement they employ.

SUMMARY

Accordingly, the present disclosure provides a heat dissipation device that has an improved heat transfer performance.

According to one aspect of the present disclosure, a heat dissipation device includes an upper cover, a lower cover, a plurality of first supporting posts, a plurality of heat transfer plates, a plurality of second supporting posts, a first wick, a plurality of second wicks, a third wick, an upper wick, and a gas-liquid separation plate. The lower cover and the upper cover together form a sealed vacuum chamber therebetween. The sealed vacuum chamber includes an evaporation area, a condensation area, and a transportation area. The condensation area is located further away from the lower cover than the evaporation area and the transportation area. The transportation area is located adjacent to the evaporation area. The plurality of first supporting structures each have a top surface and a bottom surface that are respectively connected to a first inner surface of the upper cover and a first inner surface of the lower cover so as to support the upper cover and the lower cover. The plurality of heat transfer structures each have a bottom surface connected to the first inner surface of the lower cover. Each of the plurality of heat transfer structures has a height smaller than a height of each of the plurality of first supporting structures. Each of the plurality of heat transfer structures is connected to some of the plurality of first supporting structures. The plurality of second supporting structures each have a top surface and a bottom surface that are respectively connected to the first inner surface of the upper cover and a second inner surface of the lower cover so as to support the upper cover and the lower cover. The second inner surface of the lower cover surrounds the first inner surface of the lower cover. The first wick is located in the evaporation area. The first wick is attached on the first inner surface of the lower cover. The plurality of second wicks are located in the evaporation area. The plurality of second wicks are attached on the plurality of first supporting structures and the plurality of heat transfer structures. The third wick is attached on the second inner surface of the lower cover and the plurality of second supporting structures. The third wick is connected to and in fluid communication with the first wick. The upper wick is located in the condensation area. The upper wick is attached on the first inner surface of the upper cover. The upper wick is in fluid communication with the plurality of second wicks and the third wick. The gas-liquid separation plate is attached on a planar area of the third wick that is located in the transportation area so as to separate a vapor formed in the evaporation area from a liquid returning from the transportation area.

According to another aspect of the present disclosure, a heat dissipation device includes an upper cover, a lower cover, an upper wick, a plurality of heat transfer plates, a first wick, a plurality of second wicks, a third wick, and a gas-liquid separation plate. The lower cover and the upper cover together form a sealed vacuum chamber therebetween. The sealed vacuum chamber includes an evaporation area, a condensation area, and a transportation area. The condensation area is located further away from the lower cover than the evaporation area and the transportation area. The transportation area is located adjacent to the evaporation area. The upper wick is located in the condensation area. The upper wick is attached on a first inner surface of the upper cover. The plurality of heat transfer structures each have a bottom surface connected to a first inner surface of the lower cover. The first wick is located in the evaporation area. The first wick is attached on the first inner surface of the lower cover. The plurality of second wicks is located in the evaporation area. The plurality of second wicks are attached on the plurality of heat transfer structures and in fluid communication with the upper wick. The third wick is attached on a second inner surface of the lower cover. The third wick is connected to the first wick and in fluid communication with the first wick and the upper wick. The second inner surface of the lower cover surrounds the first inner surface of the lower cover. The gas-liquid separation plate is attached on a planar area of the third wick that is located in the transportation area so as to separate a vapor formed in the evaporation area from a liquid returning from the transportation area.

According to another aspect of the present disclosure, a heat dissipation device includes an upper cover, a lower cover, an upper wick, a first wick, a plurality of second wicks, a third wick, and a gas-liquid separation plate. The lower cover and the upper cover together form a sealed vacuum chamber therebetween. The sealed vacuum chamber includes an evaporation area, a condensation area, and a transportation area. The upper wick is located in the condensation area. The upper wick is attached on a first inner surface of the upper cover. The first wick is located in the evaporation area. The first wick is attached on a first inner surface of the lower cover. The plurality of second wicks is located in the evaporation area. The plurality of second wicks are attached on the lower cover and in fluid communication with the upper wick. The third wick is attached on a second inner surface of the lower cover. The third wick is connected to the first wick and in fluid communication with the first wick and the upper wick. The second inner surface of the lower cover surrounds the first inner surface of the lower cover. The gas-liquid separation plate is attached on a planar area of the third wick that is located in the transportation area so as to separate a vapor formed in the evaporation area from a liquid returning from the transportation area.

According to the heat dissipation device discussed above, because of the arrangement of the above different types of wicks, the heat dissipation device can obtain various advantages contributed from different wicks so as to make the working fluid quickly and fully involve the heat transfer circulation of gas-liquid two-phase flow, thereby increasing the heat transfer performance of the heat dissipation device.

Further, because the gas-liquid separation plates in the transportation areas improves a cross-sectional area of the effective wettability of the wicks and thus significantly reduces the droplet splashes and the resistance of condensed working fluid at the liquid-vapor interface, such that the evaporated working fluid of the gaseous form flowing from the evaporation area and the condensed working fluid of the liquid form flowing from the transportation areas will not interfere with each other, making the return of the condensed working fluid to the evaporation area more quickly and thereby efficiently increasing the evaporation speed of the working fluid in the evaporation area. Accordingly, the heat transfer performance of the heat dissipation device is still can be significantly increased despite the very limited internal space.

BRIEF DESCRIPTION OF THE DRAWINGS

The present disclosure will become more fully understood from the detailed description given hereinbelow and the accompanying drawings which are given by way of illustration only and thus are not intending to limit the present disclosure and wherein.

DETAILED DESCRIPTION

In order to make the purpose, the technical solutions, and the advantages of the embodiments of the present disclosure clearer, the technical solutions in the embodiments of the present disclosure will be clearly and completely described with reference to the accompanying drawings in the embodiments of the present disclosure. Obviously, the described embodiments are part of the embodiments of the present disclosure, rather than all the embodiments. All other embodiments that are based on the embodiments of the present disclosure and acquired by one skilled in the art without creative work should fall within the scope of the present disclosure.

The exemplary embodiments and the description thereof of the present disclosure are intended to explain the present disclosure rather than to restrict the present disclosure. In addition, elements/components with the same or similar reference numerals in the accompanying drawing and the embodiments are used to represent the same or similar parts.

The terms about directions used in the specification, such as up, down, left, right, front, back, etc., are only used for describing the directions in the accompanying drawings. Therefore, these terms are used for easier description rather than restriction on the present disclosure.

The terms used in the specification, such as "include", "comprise", "have", "contain", etc., are open-ended terms and mean including but not limit to.

The term "and/or" used in the specification includes any one or combination of the components.

The terms "multiple" and "a plurality of" used in the specification include "two" and "two or more". The term "multiple groups" used in the specification includes "two groups" and "two or more groups".

Some terms used to describe the present disclosure will be discussed hereinafter or another place in the specification so as to provide one skilled in the art with additional guidance on the description of the present disclosure.

Figure 1:
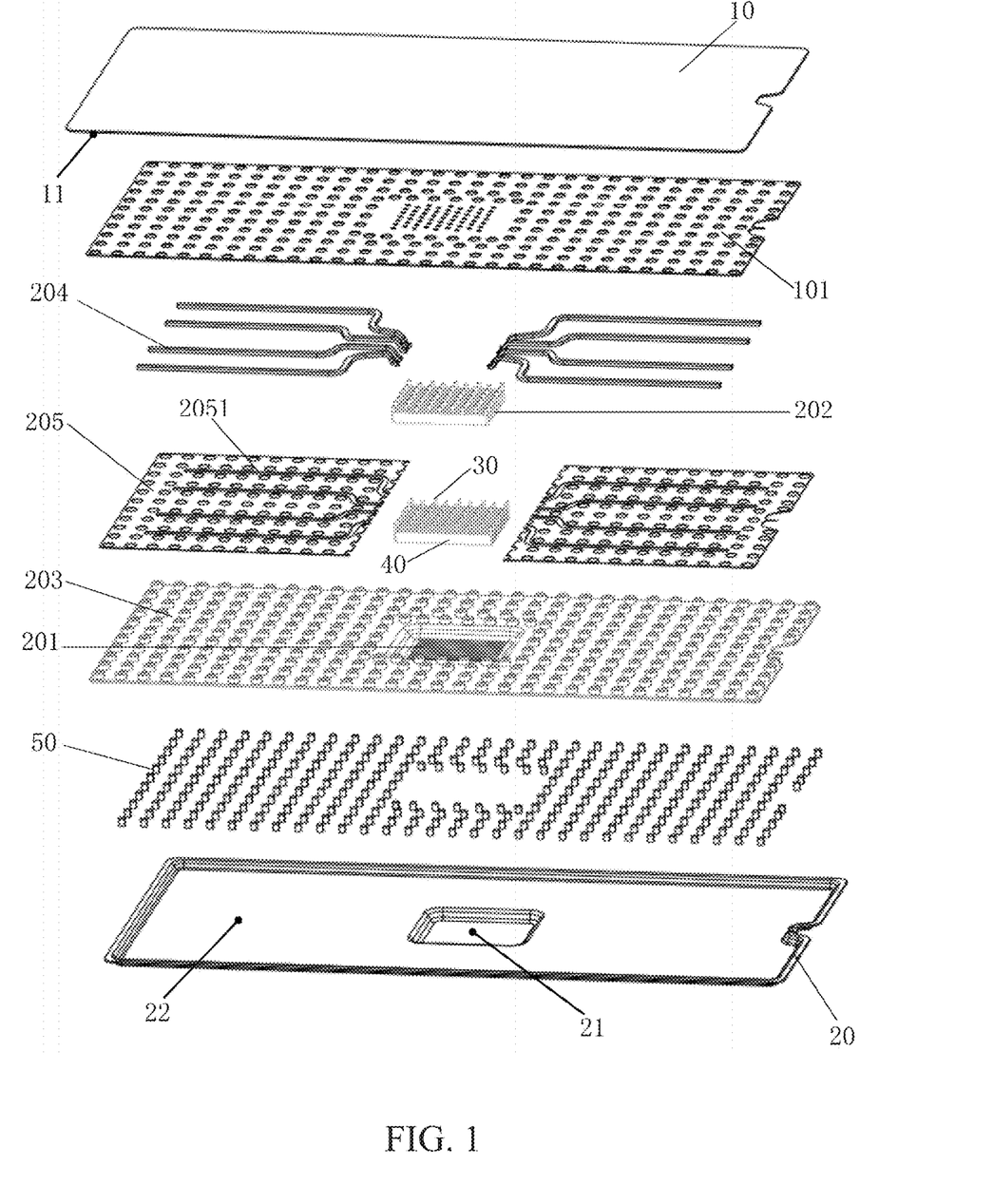
FIG. 1 is an exploded view of a heat dissipation device according to the present disclosure.
Figure 2:
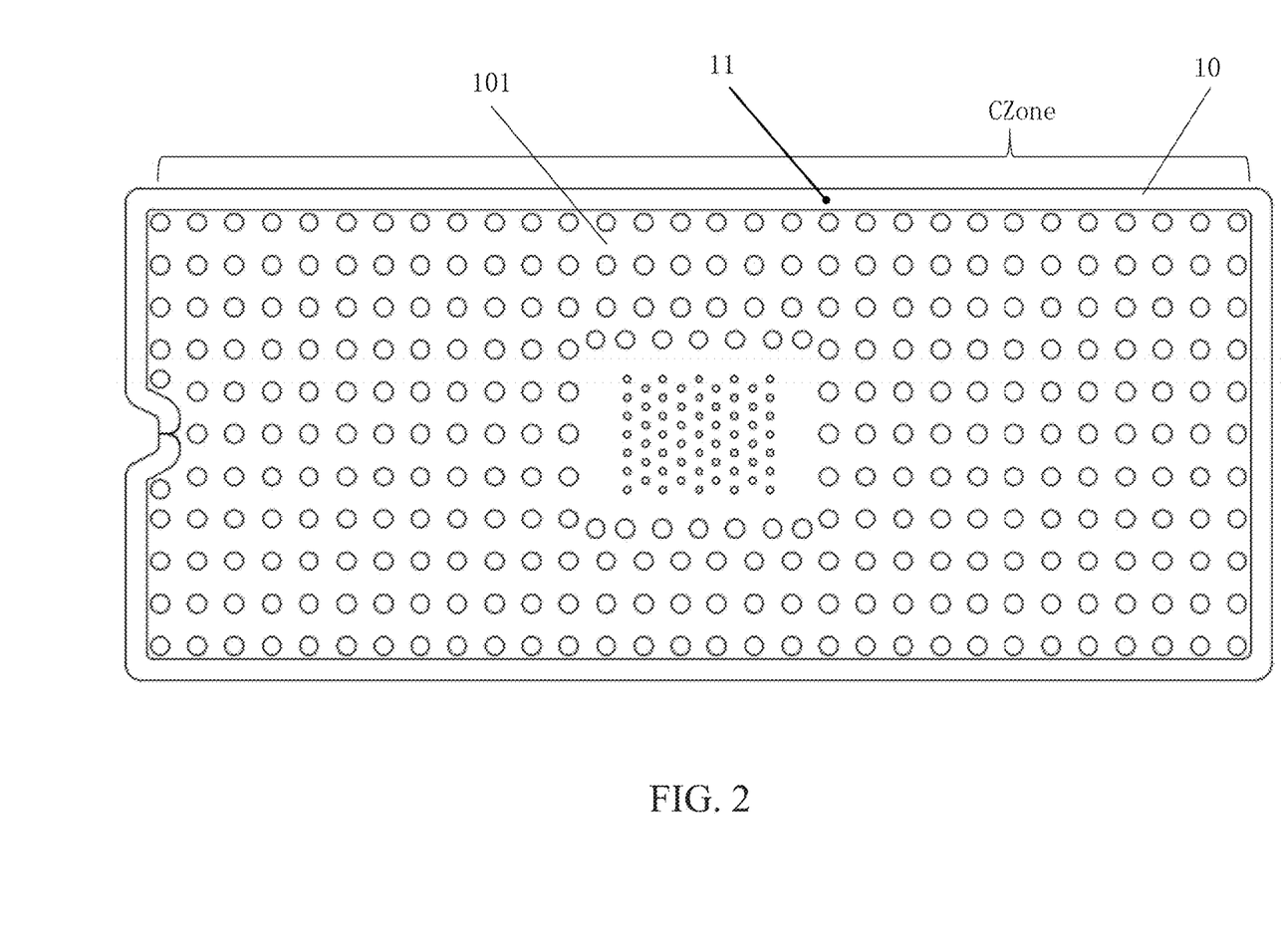
FIG. 2 is a top view of an upper cover of a heat dissipation device according to the present disclosure.
Figure 3:
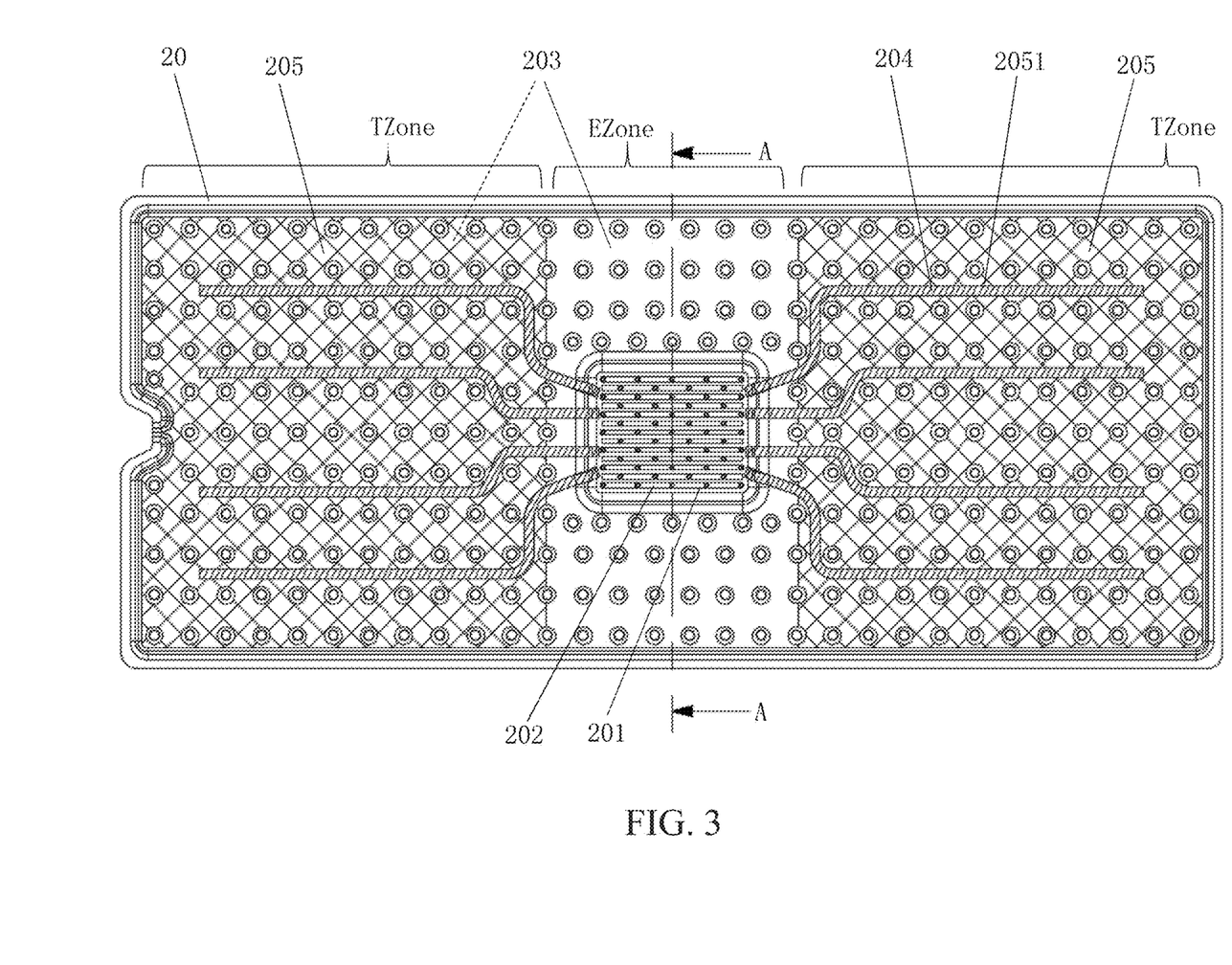
FIG. 3 is a bottom view of a lower cover of a heat dissipation device according to the present disclosure.
Figure 4:
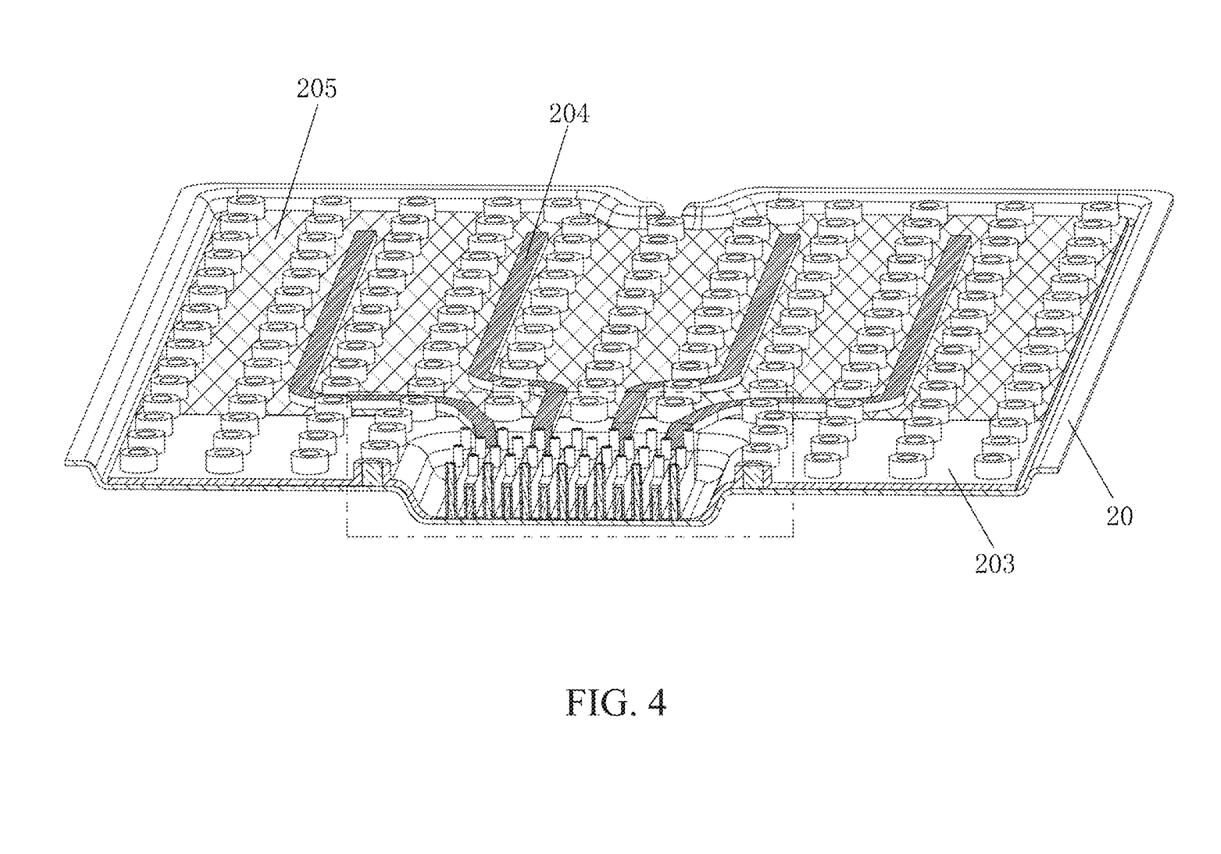
FIG. 4 is a perspective view of the sectioned lower cover of the heat dissipation device along line A-A in FIG. 3.
Figure 4A:
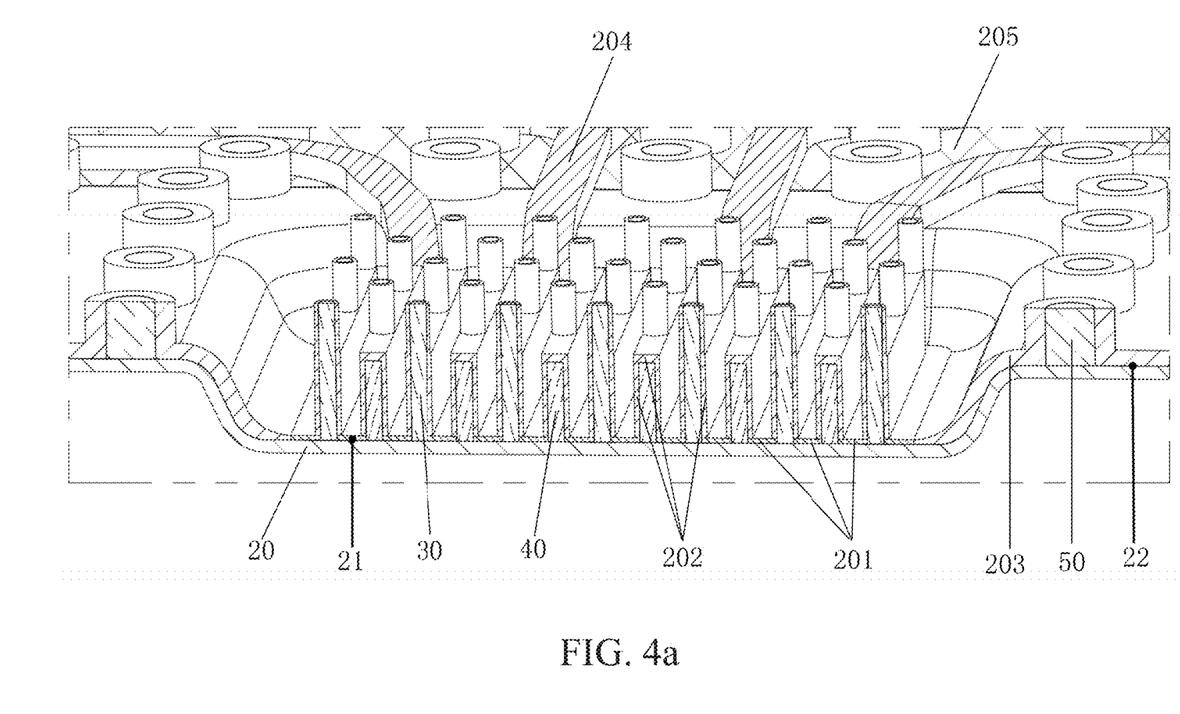
FIG. 4a is a partial and enlarged view of the sectioned lower cover of the heat dissipation device in FIG. 4.

Please refer to FIG. 1 to FIG. 4a, where FIG. 1 is an exploded view of a heat dissipation device according to the present disclosure, FIG. 2 is a top view of an upper cover of a heat dissipation device according to the present disclosure, FIG. 3 is a bottom view of a lower cover of a heat dissipation device according to the present disclosure, FIG. 4 is a perspective view of the sectioned lower cover of the heat dissipation device along line A-A in FIG. 3, FIG. 4a is a partial and enlarged view of the sectioned lower cover of the heat dissipation device in FIG. 4. As shown, the heat dissipation device includes an upper cover 10, a lower cover 20, an upper wick 101, a first wick 201, a plurality of second wicks 202, a third wick 203, a plurality of fourth wicks 204, a plurality of first supporting posts 30, a plurality of heat transfer plates 40, a plurality of second supporting posts 50, and gas-liquid separation plates 205. The first supporting posts 30 each have a top surface and a bottom surface that are respectively connected to a first inner surface 11 of the upper cover 10 and a first inner surface 21 of the lower cover 20. The heat transfer plates 40 each have a bottom surface connected to the first inner surface 21 of the lower cover 20. Each heat transfer plate 40 is connected to some of the first supporting posts 30. Each of the heat transfer plates 40 has a height smaller than a height of each of the first supporting posts 30. The second supporting posts 50 each have a top surface and a bottom surface that are respectively connected to the first inner surface 11 of the upper cover 10 and a second inner surface 22 of the lower cover 20. The upper cover 10 and the lower cover 20 together form a sealed vacuum chamber therebetween. The sealed vacuum chamber includes an evaporation area EZone, a condensation area CZone, and two transportation areas TZone. The evaporation area EZone is located between the transportation areas TZone. The first wick 201 and the second wicks 202 are located in the evaporation area EZone. The first wick 201 is a two-dimensional wick attached on the first inner surface 21 of the lower cover 20. Each of the second wicks 202 is a three-dimensional wick attached on the first supporting posts 30 and the heat transfer plates 40. The upper wick 101 is a two-dimensional wick located in the condensation area CZone and attached on the first inner surface 11 of the upper cover 10. The upper wick 101 is in fluid communication with the second wicks 202 and the third wick 203. The third wick 203 is a three-dimensional wick located in the transportation areas TZone and the evaporation area EZone and attached on the second inner surface 22 of the lower cover 20 and the second supporting posts 50. The third wick 203 is connected to and in fluid communication with the first wick 201. The fourth wicks 204 are distributed in the transportation areas TZone and attached on the third wick 203, and each of the fourth wicks 204 has an end extending to and in fluid communication with the first wick 201. Each of the fourth wicks 204 has a height greater than a height of the third wick 203. The gas-liquid separation plates 205 are attached on a planar area of the third wick 203 in the transportation areas TZone, and the gas-liquid separation plates 205 have a plurality of grooves 2051 that correspond to the fourth wicks 204 and are used for the distribution of the fourth wicks 204 therein.

Note that:
(1) The upper cover 10 in this embodiment is a flat structure. The lower cover 20 has a recessed portion at its center and used for being placed closer to a heat source (not shown). An inner bottom surface of the recessed portion of the lower cover 20 denote the first inner surface 21. The lateral surfaces of the recessed portion and rest inner bottom surface of the lower cover 20 other than the recessed portion denote the second inner surface 22. Although the above describes an example configuration of the first and second inner surfaces of the lower cover, other configurations are possible. In some other embodiments, the first inner surface 21 and the second inner surface 22 of the lower cover may be coplanar.
(2) The first supporting posts 30 and the second supporting posts 50 together support the upper cover 10 and the lower cover 20 of the heat dissipation device and therefore can enhance the anti-pressure ability, such that the deformation, such as partial indentation or partial expansion, is prevented from occurring on the heat dissipation device, and which can secure the existence and stability of the internal space for the two-phase working fluid. Accordingly, the heat transfer performance of the heat dissipation device is secured. The first supporting posts 30, the second supporting posts 50, and the heat transfer plates 40 are integrally formed with the lower cover 20. Alternatively, one or more of the first supporting posts 30, the second supporting posts 50, and the heat transfer plates 40 may be fixed to the upper cover 10 or the lower cover 20 by welding, diffusion bonding, hot pressing, soldering, brazing, or adhesive. Each of the first supporting posts 30 and each of the second supporting posts 50 has a cylindrical shape, and each second supporting post 50 has a diameter greater than a diameter of each first supporting post 30. Alternatively, each of the first supporting posts 30 and each of the second supporting posts 50 may have a cylindrical, square, rectangular, or any suitable polygonal shape.
(3) The heat transfer plates 40 in this embodiment are substantially rectangular and arranged in parallel with one another, and the heat transfer plates 40 are spaced apart from one another and are evenly distributed in the whole evaporation area EZone. Note that the distribution of the heat transfer plates 40 is an example but not intended to limit the present disclosure. In some other embodiments, the heat transfer plates 40 may be arranged to be non-parallel to one another so as to form a distribution of radial shape, cross shape or any suitable shape. The arrangement of the heat transfer plates 40 is to enhance the structural strength of the first supporting posts 30 and increase the heat dissipation surface of the evaporation area EZone.
(4) One or more of the first wick 201, the second wicks 202, the third wick 203, the fourth wicks 204, and the upper wick 101 are formed by sintering powder, wire mesh, or fiber.
(5) The gas-liquid separation structures 205 are two pieces of metal foil, preferably copper foil, that are attached on the planar area of the third wick 203 in the transportation areas TZone by sintering. Although, in this embodiment, there are two gas-liquid separation plates 205 respectively located at two opposite sides of the evaporation area EZone, it is understood that the quantity of the gas-liquid separation plates 205 is an example and not intended to limit the present disclosure. In some other embodiments, the quantity and the locations of the gas-liquid separation plates 205 can be modified according to the actual arrangement of the transportation areas TZone.
(6) Although, in this embodiment, there are eight fourth wicks 204 symmetrically arranged, it is understood that the quantity, arrangement, length, and overall shape of the fourth wicks 204 can be modified according to actual requirements.

Figure 5:
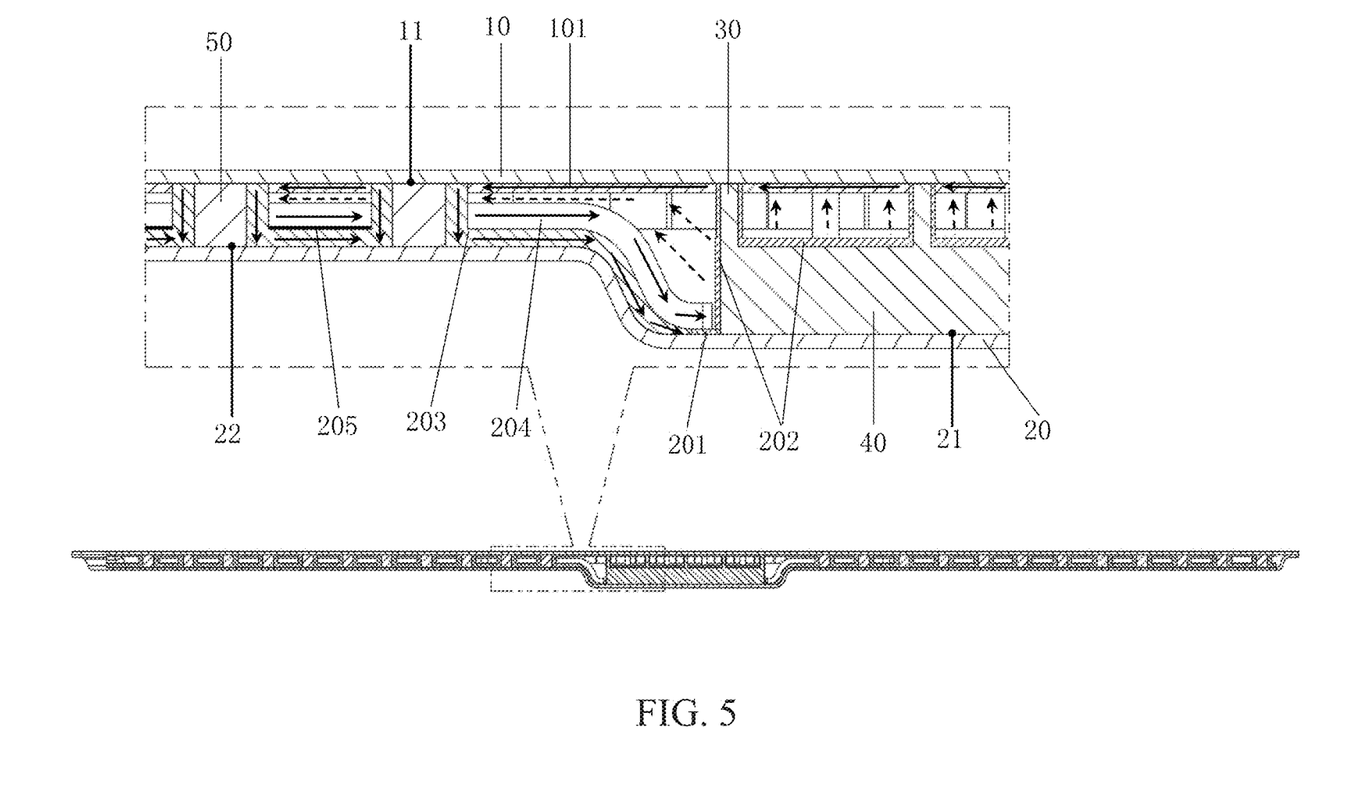
FIG. 5 is a cross-sectional view of the heat dissipation device according to the present disclosure.

Please refer to FIG. 5, there is shown a cross-sectional view of the heat dissipation device according to the present disclosure. As shown in FIG. 5, the dotted arrows denote the flow directions of the evaporated working fluid that caused by the heat absorbed from the evaporation area, and the solid arrows denote the flow directions of the condensed working fluid. The operation of the heat dissipation device is described in detail hereinafter with reference to FIG. 5. The heat generated by an external heat source (not shown) can be The heat generated by an external heat source (not shown) can be absorbed into the evaporation area EZone via the first inner surface 21 of the lower cover 20. Working fluid flowing through the first wick 201 attached on the first inner surface 21 of the lower cover 20, the second wicks 202 attached on the first supporting structures 30 and the heat transfer structures 40, and the third wick 203 in the evaporation area EZone is evaporated to vapor. The evaporation generates a pressure difference that forces the vapor and heat to flow towards the condensation area CZone. The vapor reaching the condensation area CZone is then condensed into liquid flowing through the upper wick 101 attached on the upper cover 10 and releasing and transferring heat into the condensation area CZone. The condensed working fluid flows back to the evaporation area EZone via the third wick 203 attached on the second inner surface 22 of the lower cover 20 and the second supporting structures 50 and the fourth wicks 204 attached on the third wick 203 in the transportation areas TZone so as to form a circulation of gas-liquid two-phase flow. During the circulation, the gas-liquid separation plates 205 attached on the planar area of the third wick 203 in the transportation areas TZone are configured to separate the evaporated working fluid formed in the evaporation area EZone from the condensed working fluid returning from the transportation areas TZone, such that the evaporated working fluid of the gaseous form flowing from the evaporation area EZone and the condensed working fluid of the liquid form flowing from the transportation areas TZone will not interfere with each other.

Further: the first wick 201 has a thickness less than a thickness of each of the second wicks 202. The first wick 201 and the second wicks 202 have a relatively strong capillary action force; that is, both of the first wick 201 and the second wicks 202 have a relatively strong heat-transfer ability so as to quickly evaporate the working fluid in the evaporation area EZone and therefore to efficiently absorb heat generated by a heat source (not shown). The third wick 203 has a capillary action force weaker than that of the first wick 201, the third wick 203 has a thickness greater than the that of the first wick 201, and the third wick 203 has a permeability greater than a permeability of the first wick and a permeability of each of the second wicks 202, such that the third wick 203 can absorb and transfer a relatively large amount of liquid and has a relatively small resistance to against the return of the liquid. The fourth wicks 204 each have a thickness greater than that of the third wick 203, and the fourth wicks 204 each have a permeability greater than that of the third wick 203, such that the distribution of the fourth wicks 204 can be served to help speed up the return flow. Accordingly, because of the arrangement of the above different types of wicks, the heat dissipation device can obtain various advantages contributed from different wicks so as to make the working fluid quickly and fully involve the heat transfer circulation of gas-liquid two-phase flow. Also, because the gas-liquid separation plates in the transportation areas TZone reduces the resistance to the flow of the condensed working fluid, making the return of the condensed working fluid to the evaporation area EZone more quickly and thereby increasing the heat transfer performance of the heat dissipation device.

Figure 6A:
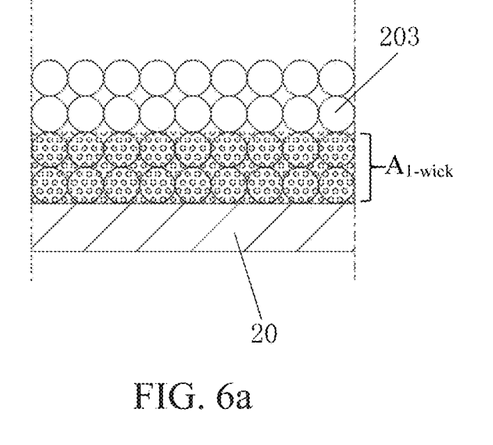
FIG. 6a is a schematic view showing a cross-sectional area of the effective wettability of the conventional wick.
Figure 6B:
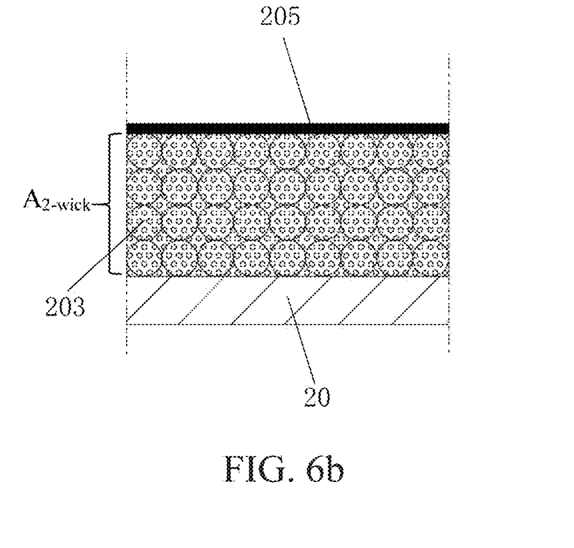
FIG. 6b is a schematic view showing a cross-sectional area of the effective wettability of a wick according to the present disclosure.

Please refer to FIG. 6a and FIG. 6b, where FIG. 6a is a schematic view showing a cross-sectional area of the effective wettability of the conventional wick, and FIG. 6b is a schematic view showing a cross-sectional area of the effective wettability of a wick according to the present disclosure. Heat transfer power of the heat dissipation device denotes Q and can, theoretically, be obtained by the following formula:

$$Q = \frac{2A_{wick} k_{wick}}{r_C L_{Effective}} \frac{\rho_1 \sigma \lambda}{\mu_1}$$

wherein, $A_{wick}$ denotes a cross-sectional area of effective wettability of a wick, $k_{wick}$ denotes the wick permeability, $\rho_1$ denotes a density of working fluid, $\sigma$ denotes surface tension of the working fluid, $\lambda$ denotes latent heat of the working fluid, $r_c$ denotes a radius of the wick, $L_{Effective}$ denotes an effective length, and denotes viscosity of the working fluid.

If the parameters other than that in the above formula do not change, the heat transfer power Q of the heat dissipation device is proportional to the cross-sectional area of effective wettability $A_{wick}$. The larger the cross-sectional area of effective wettability $A_{wick}$, the higher the heat transfer power Q. As shown in FIG. 6a, in the conventional wick, the vapor caused by heat absorbed from the evaporation area and the liquid transported back by the wick share the same vacuum chamber, and the vapor occupies part of the space above the surface of the wick. As shown in FIG. 6b, in the present disclosure, the gas-liquid separation plates 205 attached on the surface of the wick can prevent vapor from occupying the space near of the wick; therefore, the cross-sectional area of effective wettability $A_{2\text{-}wick}$ of the present application is greater than the cross-sectional area of effective wettability $A_{1\text{-}wick}$ of the conventional wick, such that the wick in the transportation areas can transport much more condensed working fluid so as to bring more condensed working fluid back to the evaporation area, keeping the evaporation area moist to enable a higher heat flux and thereby improving the heat transfer performance of the heat dissipation device.

Figure 7A:
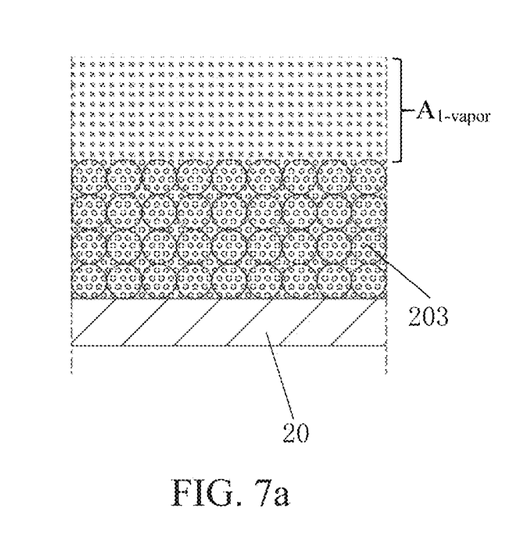
FIG. 7a depicts a liquid-vapor interface within a conventional vapor chamber.
Figure 7B:
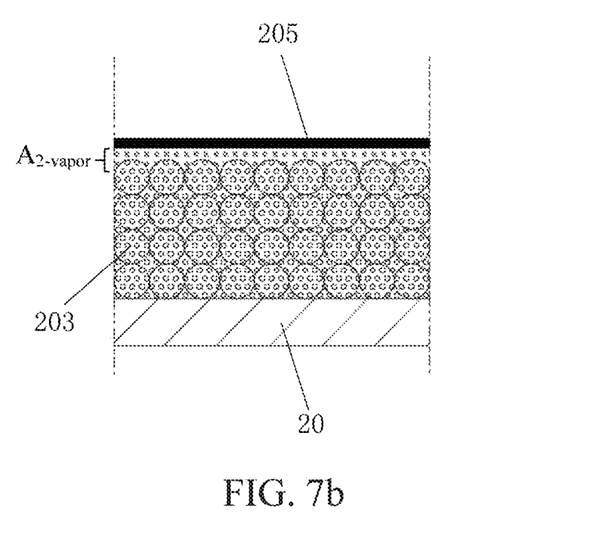
FIG. 7b depicts a liquid-vapor interface within the heat dissipation device according to the present disclosure.

Please refer to FIG. 7a and FIG. 7b, where FIG. 7a depicts a liquid-vapor interface within a conventional vapor chamber, and FIG. 7b depicts a liquid-vapor interface within the heat dissipation device according to the present disclosure. During the operation, the vapor flowing toward the condensation area that is generated by heat absorbed from the evaporation area and the condensed liquid that returns via the wicks in the transportation areas share the same vacuum chamber, and they will interfere with each other, thus the shear stress occurs at the liquid-vapor interface. As a result, the condensed working fluid on the surface of the wicks may occur droplet splashing, and the surface tension at the interface may be increased, thereby affecting the return of the condensed working fluid flow to the evaporation area. This influence can be reflected by the splash limitation $q_{Entrain}$ at the liquid-vapor interface, and $q_{Entrain}$ can, theoretically, be obtained by the following formula:

$$q_{Entrain} = A_{vapor}\left[\lambda_{fg} \cdot \left(\frac{\sigma \cdot \rho_v}{2 \cdot r_c}\right)^{\frac{1}{2}}\right]$$

wherein, $A_{vapor}$ denotes a cross-sectional area of vapor, $\lambda_{fg}$ denotes latent of working fluid, $\sigma$ denotes surface tension, $\rho_v$ denotes a density of the vapor, and $r_c$ denotes a radius of a wick.

If the parameters other than that in the above formula do not change, the splash limitation $q_{Entrain}$ is proportional to the cross-sectional area of vapor $A_{vapor}$. The smaller the cross-sectional area of vapor A vapor, the lower the splash limitation $q_{Entrain}$. The splash limitation $q_{Entrain}$ may approach to an infinitesimal value, meaning that the droplet splashes may not occur and thus increase the heat transfer performance of the heat dissipation device. As shown in FIG. 7a, in the conventional vapor chamber, the liquid-vapor interface has no structure for reducing the interference between the vapor and liquid, and the cross-sectional area of vapor $A_{1\text{-}vapor}$ is relatively large (meaning that the splash limitation is also relatively large), thus droplets splashing will occur at the interface of the condensed working fluid and thereby affecting the return flow of the condensed working fluid, significantly reducing the heat transfer performance of the heat dissipation device. As shown in FIG. 7b, the gas-liquid separation plates 205 are disposed at the liquid-vapor interface, such that the cross-sectional area of vapor $A_{2\text{-}vapor}$ at the liquid-vapor interface is relatively small, even making the splash limitation extremely approach to an infinitesimal value. In such a case, the droplets splashing is prevented from occurring at the condensed working fluid near the surface of the wick, which can significantly reduce the resistance at the liquid-vapor interface; thus, the condensed working fluid is efficiently flowing back to the evaporation area to perform the heat transfer circulation of gas-liquid two-phase flow and thereby significantly increasing the heat transfer performance of the heat dissipation device.

Figure 8:
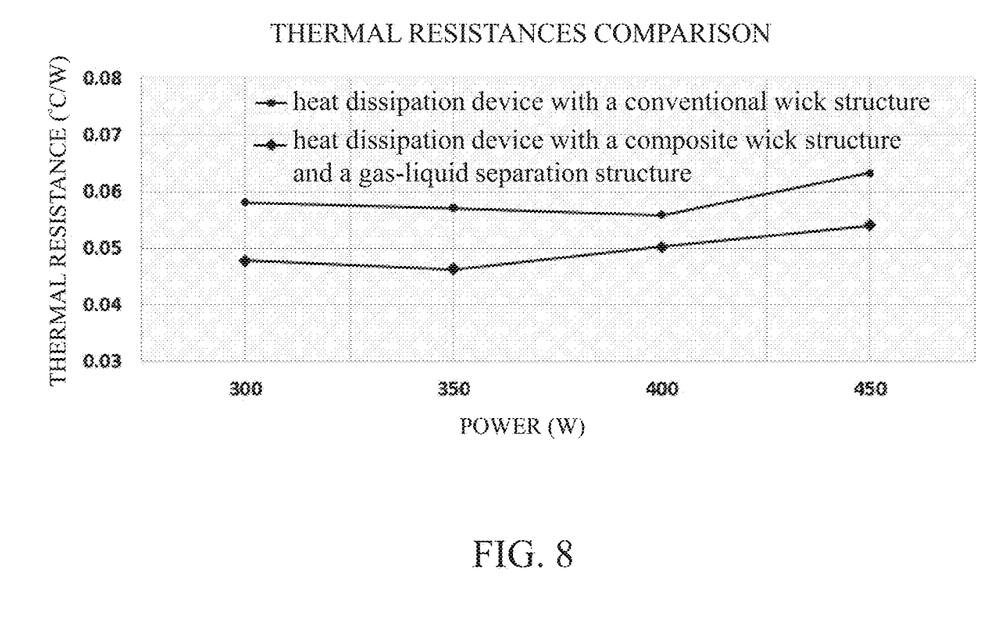
FIG. 8 is a chart showing a thermal resistances comparison between a heat dissipation device with a conventional wick and the heat dissipation device according to the present disclosure with a composite wick structure and gas-liquid separation plates.

Please refer to FIG. 8, which is a chart showing a thermal resistances comparison between a heat dissipation device with a conventional wick and the heat dissipation device according to the present disclosure with a composite wick structure and gas-liquid separation plates. Note that the heat transfer performance of the heat dissipation device is generally reflected by thermal resistance value; the lower the thermal resistance, the better the heat transfer performance of the heat dissipation device. In the comparison test, a heat dissipation device with a typical wick structure but without a gas-liquid separation plate is compared with a heat dissipation device with a composite wick structure and a gas-liquid separation plate, in order to evaluate the influence that the gas-liquid separation plate acts on the thermal resistance. The thermal resistance test was performed under the following conditions:

| | |
|---|---|
| Heat Dissipation Device Supplier | Cooler Master |
| Clamping force | 200 lbf |
| CPU | As a heat source |
| Test Environment | Open System |
| Environment Temperature | 25° C. |
| Environment Relative Humidity | 60% |
| Flow rate | 100 CFM |
| Heat Dissipation Device Lubricant | TC-5888 |

As the test result shown in FIG. 8, the heat dissipation device that has the composite wick structures and the gas-liquid separation plates has a significantly low thermal resistance compared to that of the conventional heat dissipation device without any gas-liquid separation plate. That is, the heat transfer performance of the heat dissipation device according to the present disclosure is significantly higher than that of the conventional heat dissipation device, with an increase of about 20% to 25%. Therefore, by the gas-liquid separation plates, the heat transfer performance of the heat dissipation device is still can be significantly increased despite the very limited internal space.

In the abovementioned embodiments, the first supporting posts 30 and the second supporting posts 50 where the second wicks 202 and the third wick 203 are attached are not intended to restrict the present disclosure. In some other embodiments, the heat dissipation device may only include one of the first supporting posts and the second supporting posts. In some other embodiments, the heat dissipation device may include no supporting structure.

For example, the heat dissipation device may include an upper cover, a lower cover, an upper wick, a plurality of heat transfer plates, a first wick, a plurality of second wicks, a third wick, and gas-liquid separation plates. The upper cover, the lower cover, the upper wick, the heat transfer plates, the first wick, the second wicks, the third wick, and the gas-liquid separation plates in this embodiment are similar to the upper cover 10, the lower cover 20, the upper wick 101, the heat transfer plates 40, the first wick 201, the second wicks 202, the third wick 203, and the gas-liquid separation plates 205 of the embodiment in FIG. 1. Only differences between this and the embodiment in FIG. 1 will be illustrated hereinafter:

The lower cover and the upper cover together form a sealed vacuum chamber therebetween. The sealed vacuum chamber includes an evaporation area, a condensation area, and transportation areas. The condensation area is located further away from the lower cover than the evaporation area and the transportation areas. The transportation areas are located adjacent to the evaporation area. The upper wick is located in the condensation area.

The upper wick is attached on a first inner surface of the upper cover.

The heat transfer plates each have a bottom surface connected to a first inner surface of the lower cover. The first wick is located in the evaporation area. The first wick is attached on the first inner surface of the lower cover. The second wicks are located in the evaporation area. The second wicks are attached on the heat transfer plates and in fluid communication with the upper wick. The third wick is attached on a second inner surface of the lower cover.

The third wick is connected to the first wick, and the third wick is in fluid communication with the first wick and the upper wick. The gas-liquid separation plates are attached on a planar area of the third wick that is located in the transportation areas so as to separate a vapor formed in the evaporation area from a liquid returning from the transportation areas.

In this and some embodiments of the present disclosure, the heat dissipation device may further include a plurality of fourth wicks. The gas-liquid separation plates have a plurality of grooves that correspond to the fourth wicks. The fourth wicks are attached on the third wick via the grooves of the gas-liquid separation plates. Each fourth wick has an end extending to and in fluid communication with the first wick.

In this and some embodiments of the present disclosure, the second wicks each have a thickness greater than or equal to a thickness of the first wick. The third wick has a thickness greater than or equal to the thickness of the first wick. The third wick has a capillary action force weaker than a capillary action force of the first wick. The third wick has a permeability greater than a permeability of the first wick and a permeability of the plurality of second wicks. The fourth wicks each have a thickness greater than the thickness of the third wick. The fourth wicks each have a permeability greater than a permeability of the third wick.

For another example, the heat dissipation device may include an upper cover, a lower cover, an upper wick, a first wick, a plurality of second wicks, a third wick, and gas-liquid separation plates. The upper cover, the lower cover, the upper wick, the first wick, the second wicks, the third wick, and the gas-liquid separation plates in this embodiment are similar to the upper cover 10, the lower cover 20, the upper wick 101, the first wick 201, the second wicks 202, the third wick 203, and the gas-liquid separation plates 205 of the embodiment in FIG. 1. Only differences between this and the embodiment in FIG. 1 will be illustrated hereinafter:

The lower cover and the upper cover together form a sealed vacuum chamber therebetween. The sealed vacuum chamber includes an evaporation area, a condensation area, and transportation areas. The condensation area is located further away from the lower cover than the evaporation area and the transportation areas. The transportation areas are located adjacent to the evaporation area. The upper wick is located in the condensation area. The upper wick is attached on a first inner surface of the upper cover. The first wick is located in the evaporation area. The first wick is attached on a first inner surface of the lower cover. The second wicks are located in the evaporation area. The second wicks are attached on the lower cover and in fluid communication with the upper wick. The third wick is attached on a second inner surface of the lower cover. The third wick is connected to the first wick, and the third wick is in fluid communication with the first wick and the upper wick. The gas-liquid separation plates are attached on a planar area of the third wick in the transportation area so as to separate a vapor formed in the evaporation area from a liquid returning from the transportation areas.

In this and some embodiments of the present disclosure, the heat dissipation device may further include a plurality of fourth wicks. The gas-liquid separation plates have a plurality of grooves that correspond to the fourth wicks. The fourth wicks are attached on the third wick via the grooves of the gas-liquid separation plates. Each fourth wick has an end extending to and in fluid communication with the first wick.

In this and some embodiments of the present disclosure, the second wicks each have a thickness greater than or equal to a thickness of the first wick. The third wick has a thickness greater than or equal to the thickness of the first wick. The third wick has a capillary action force weaker than a capillary action force of the first wick. The third wick has a permeability greater than a permeability of the first wick and a permeability of the plurality of second wicks. The fourth wicks have a thickness greater than the thickness of the third wick. The fourth wicks each have a permeability greater than a permeability of the third wick.

According to the heat dissipation device discussed above, because of the arrangement of the above different types of wicks, the heat dissipation device can obtain various advantages contributed from different wicks so as to make the working fluid quickly and fully involve the heat transfer circulation of gas-liquid two-phase flow. Also, because the gas-liquid separation plates in the transportation areas improves a cross-sectional area of the effective wettability of the wicks and thus significantly reduces the droplet splashes and the resistance of condensed working fluid at the liquid-vapor interface, such that the evaporated working fluid of the gaseous form flowing from the evaporation area and the condensed working fluid of the liquid form flowing from the transportation areas will not interfere with each other, making the return of the condensed working fluid to the evaporation area more quickly and thereby efficiently increasing the evaporation speed of the working fluid in the evaporation area. Accordingly, the heat transfer performance of the heat dissipation device is still can be significantly increased despite the very limited internal space.

The embodiments are chosen and described in order to best explain the principles of the present disclosure and its practical applications, to thereby enable others skilled in the art best utilize the present disclosure and various embodiments with various modifications as are suited to the particular use being contemplated. It is intended that the scope of the present disclosure is defined by the following claims and their equivalents.

What is claimed is:

1. A heat dissipation device,
comprising: an upper cover;
a lower cover, wherein the lower cover and the upper cover together form a sealed vacuum chamber therebetween, the sealed vacuum chamber comprises an evaporation area, a condensation area, and a transportation area, the condensation area is located further away from the lower cover than the evaporation area and the transportation area, and the transportation area is located adjacent to the evaporation area;
a plurality of first supporting posts, wherein the plurality of first supporting posts each have a top surface and a bottom surface that are respectively connected to a first inner surface of the upper cover and a first inner surface of the lower cover so as to support the upper cover and the lower cover;
a plurality of heat transfer plates, wherein the plurality of heat transfer plates each have a bottom surface connected to the first inner surface of the lower cover, each of the plurality of heat transfer plates has a height smaller than a height of each of the plurality of first supporting posts, and each of the plurality of heat transfer plates is connected to some of the plurality of first supporting posts;
a plurality of second supporting posts, wherein the plurality of second supporting posts each have a top surface and a bottom surface that are respectively connected to the first inner surface of the upper cover and a second inner surface of the lower cover so as to support the upper cover and the lower cover, and the second inner surface of the lower cover surrounds the first inner surface of the lower cover;
a first wick, located in the evaporation area, wherein the first wick is attached on the first inner surface of the lower cover;
a plurality of second wicks, located in the evaporation area, wherein the plurality of second wicks are attached on the plurality of first supporting posts and the plurality of heat transfer plates;
a third wick, directly attached on the second inner surface of the lower cover and the plurality of second supporting posts, wherein the third wick is connected to and in fluid communication with the first wick;
an upper wick, located in the condensation area, wherein the upper wick is attached on the first inner surface of the upper cover, and the upper wick is in fluid communication with the plurality of second wicks and the third wick;
a gas-liquid separation plate, wherein the gas-liquid separation plate is attached on a planar area of the third wick that is located in the transportation area so as to separate a vapor formed in the evaporation area from a liquid returning from the transportation area; and
a plurality of fourth wicks wherein the gas-liquid separation plate has a plurality of grooves that correspond to the plurality of fourth wicks the plurality of fourth wicks are attached on the third wick via the plurality of grooves of the gas-liquid separation plate and each of the plurality of fourth wicks has an end extending to and in fluid communication with the first wick,
wherein the plurality of second wicks are surrounded by the third wick and are spaced apart from the third wick by the first wick.

2. The heat dissipation device according to claim 1, wherein the plurality of second wicks each have a thickness greater than or equal to a thickness of the first wick.

3. The heat dissipation device according to claim 2, wherein the third wick has a thickness greater than or equal to the thickness of the first wick, the third wick has a capillary action force weaker than a capillary action force of the first wick, and the third wick has a permeability greater than a permeability of the first wick and a permeability of each of the plurality of second wicks.

4. The heat dissipation device according to claim 3, wherein the plurality of fourth wicks each have a thickness greater than the thickness of the third wick, and the plurality of fourth wicks each have a permeability greater than the permeability of the third wick.

5. The heat dissipation device according to claim 1, wherein the gas-liquid separation plate is metal foil.

6. The heat dissipation device according to claim 5, wherein the metal foil is copper foil.

7. The heat dissipation device according to claim 1, wherein the upper cover is a flat structure.

8. The heat dissipation device according to claim 1, wherein the lower cover has a recessed portion at a central area thereof, the first inner surface of the lower cover is an inner bottom surface of the recessed portion.

9. The heat dissipation device according to claim 1, wherein the first inner surface of the lower cover and the second inner surface of the lower cover are coplanar.

10. The heat dissipation device according to claim 1, wherein the one or more of the first wick, the plurality of second wicks, the third wick, the plurality of fourth wicks, and the upper wick are formed by sintering powder, wire mesh, or fiber.

11. The heat dissipation device according to claim 1, wherein one or more of the plurality of first supporting posts, the plurality of second supporting posts, and the plurality of heat transfer plates are fixed to the upper cover or the lower cover by welding, diffusion bonding, hot pressing, soldering, brazing, or adhesive.

12. The heat dissipation device according to claim 1, wherein the plurality of first supporting posts, the plurality of second supporting posts, and the plurality of heat transfer plates are integrally formed with the lower cover.

13. The heat dissipation device according to claim 1, wherein the plurality of first supporting posts and the plurality of second supporting posts each have a cylindrical shape, and the plurality of second supporting posts each have a diameter greater than a diameter of each of the plurality of first supporting posts.

14. The heat dissipation device according to claim 1, wherein the plurality of first supporting posts and the plurality of second supporting posts each have a cylindrical, square, rectangular, or polygonal shape.

15. The heat dissipation device according to claim 1, wherein the plurality of heat transfer plates are rectangular and arranged in parallel with one another.

16. The heat dissipation device according to claim 15, wherein the plurality of heat transfer plates are spaced apart from one another and are evenly distributed in the evaporation area.

17. A heat dissipation device, comprising:
an upper cover;
a lower cover, wherein the lower cover and the upper cover together form a sealed vacuum chamber therebetween, the sealed vacuum chamber comprises an evaporation area, a condensation area, and a transportation area, the condensation area is located further away from the lower cover than the evaporation area and the transportation area, and the transportation area is located adjacent to the evaporation area;
an upper wick, located in the condensation area, wherein the upper wick is attached on a first inner surface of the upper cover;
a plurality of heat transfer plates, wherein the plurality of heat transfer plates each have a bottom surface connected to a first inner surface of the lower cover;
a first wick, located in the evaporation area, wherein the first wick is attached on the first inner surface of the lower cover;
a plurality of second wicks, located in the evaporation area, wherein the plurality of second wicks are attached on the plurality of heat transfer plates and in fluid communication with the upper wick;
a third wick, directly attached on a second inner surface of the lower cover, wherein the third wick is connected to the first wick and in fluid communication with the first wick and the upper wick, and the second inner surface of the lower cover surrounds the first inner surface of the lower cover;
a gas-liquid separation plate, wherein the gas-liquid separation plate is attached on a planar area of the third wick that is located in the transportation area so as to separate a vapor formed in the evaporation area from a liquid returning from the transportation area; and
a plurality of fourth wicks wherein the gas-liquid separation plate has a plurality of grooves that correspond to the plurality of fourth wicks the plurality of fourth wicks are attached on the third wick via the plurality of grooves of the gas-liquid separation plate and each of the plurality of fourth wicks has an end extending to and in fluid communication with the first wick,
wherein the plurality of second wicks are surrounded by the third wick and are spaced apart from the third wick by the first wick.

18. The heat dissipation device according to claim 17, wherein the plurality of second wicks each have a thickness greater than or equal to a thickness of the first wick.

19. The heat dissipation device according to claim 18, wherein the third wick has a thickness greater than or equal to the thickness of the first wick, the third wick has a capillary action force weaker than a capillary action force of the first wick, and the third wick has a permeability greater than a permeability of the first wick and a permeability of the plurality of second wicks.

20. The heat dissipation device according to claim 19, wherein the plurality of fourth wicks each have a thickness greater than the thickness of the third wick, and the plurality of fourth wicks each have a permeability greater than the permeability of the third wick.

21. A heat dissipation device,
comprising: an upper cover;
a lower cover, wherein the lower cover and the upper cover together form a sealed vacuum chamber therebetween, the sealed vacuum chamber comprises an evaporation area, a condensation area, and a transportation area;
an upper wick, located in the condensation area, wherein the upper wick is attached on a first inner surface of the upper cover;
a first wick, located in the evaporation area, wherein the first wick is attached on a first inner surface of the lower cover;
a plurality of second wicks, located in the evaporation area, wherein the plurality of second wicks are attached on the lower cover and in fluid communication with the upper wick;
a third wick, directly attached on a second inner surface of the lower cover, wherein the third wick is connected to the first wick and in fluid communication with the first wick and the upper wick, and the second inner surface of the lower cover surrounds the first inner surface of the lower cover; and a gas-liquid separation plate, wherein the gas-liquid separation plate is attached on a planar area of the third wick that is located in the transportation area so as to separate a vapor formed in the evaporation area from a liquid returning from the transportation area; and a plurality of fourth wicks wherein the gas-liquid separation plate has a plurality of grooves that correspond to the plurality of fourth wicks the plurality of fourth wicks are attached on the third wick via the plurality of grooves of the gas-liquid separation plate and each of the plurality of fourth wicks has an end extending to and in fluid communication with the first wick, wherein the plurality of second wicks are surrounded by the third wick and are spaced apart from the third wick by the first wick.

22. The heat dissipation device according to claim 21, wherein the plurality of second wicks each have a thickness greater than or equal to a thickness of the first wick.

23. The heat dissipation device according to claim 22, wherein the third wick has a thickness greater than or equal to the thickness of the first wick, the third wick has a capillary action force weaker than a capillary action force of the first wick, and the third wick has a permeability greater than a permeability of the first wick and a permeability of the plurality of second wicks.

24. The heat dissipation device according to claim 23, wherein the plurality of fourth wicks each have a thickness greater than the thickness of the third wick, and the plurality of fourth wicks each have a permeability greater than the permeability of the third wick.

* * * * *